United States Patent
Lee

(10) Patent No.: US 7,462,291 B2
(45) Date of Patent: Dec. 9, 2008

(54) METHOD OF FABRICATING ARRAY SUBSTRATE FOR LIQUID CRYSTAL DISPLAY DEVICE

(75) Inventor: Ki-Hong Lee, Jeju-si (KR)

(73) Assignee: LG Display Co., Ltd., Seoul (KR)

( * ) Notice: Subject to any disclaimer, the term of this patent is extended or adjusted under 35 U.S.C. 154(b) by 200 days.

(21) Appl. No.: 11/401,468

(22) Filed: Apr. 11, 2006

(65) Prior Publication Data
US 2007/0026555 A1  Feb. 1, 2007

(30) Foreign Application Priority Data
Apr. 11, 2005  (KR) ............... 10-2005-0029860

(51) Int. Cl.
C30B 33/00 (2006.01)
H01L 21/00 (2006.01)
(52) U.S. Cl. ............. 216/23; 216/41; 216/58; 216/83; 438/149; 438/689; 438/706
(58) Field of Classification Search ......... 216/23, 216/41, 83, 58; 438/149, 689, 706
See application file for complete search history.

(56) References Cited

U.S. PATENT DOCUMENTS

| | | | |
|---|---|---|---|
| 5,696,388 A | 12/1997 | Funada et al. | |
| 5,705,829 A | 1/1998 | Miyanaga et al. | |
| 5,854,096 A | 12/1998 | Ohtani et al. | |
| 6,180,439 B1 | 1/2001 | Yamazaki et al. | |
| 6,639,245 B2 * | 10/2003 | Gotoh et al. | 257/72 |
| 6,727,122 B2 * | 4/2004 | Seo et al. | 438/149 |
| 2006/0073648 A1 * | 4/2006 | Park et al. | 438/166 |

OTHER PUBLICATIONS

Wong et al., "Characterization of the MIC/MILC Interface and Its Effects on the Performance of MILC Thin-Film Transistors", IEEE Transactions of Electron Devices, vol. 47, No. 3, May 2000, pp. 1661-1667.
Wang et al., "Characterization of an Individual Grain Boundary in Metal-Induced Laterally Crystallized Polycrystalline Silicon Thin-Film Devices", IEEE Transactions of Electron Devices, vol. 48, No. 3, Aug. 2001, pp. 1655-1660.

* cited by examiner

*Primary Examiner*—Shamim Ahmed
(74) *Attorney, Agent, or Firm*—Morgan Lewis & Bockius LLP

(57) ABSTRACT

A method of fabricating an array substrate for a liquid crystal display device is provided. The method includes steps of forming an amorphous silicon pattern on a substrate; forming a catalyst metal pattern on the amorphous silicon pattern; annealing the amorphous silicon pattern to be converted into a polycrystalline silicon pattern using the catalyst metal pattern as a catalyst; forming a gate insulating layer on the polycrystalline silicon pattern; forming a gate electrode on the gate insulation layer at a position corresponding to the polycrystalline silicon pattern; doping the polycrystalline silicon pattern with impurities using the gate electrode as a doping mask to form an ohmic contact layer and an active layer; forming an interlayer insulating layer having first and second contact holes on the gate electrode, the first and second contact holes exposing portions of the ohmic contact layer; and forming a source electrode and a drain electrode on the interlayer insulating layer, the source electrode and the drain electrode connected to the ohmic contact layer respectively through the first and second contact holes.

18 Claims, 9 Drawing Sheets

-separation

METHOD OF FABRICATING ARRAY SUBSTRATE FOR LIQUID CRYSTAL DISPLAY DEVICE

The present application claims the benefit of Korean Patent Application No. P2005-0029860 filed in Korea on Apr. 11, 2005, which is hereby incorporated by reference.

BACKGROUND OF THE INVENTION

1. Field of the Invention

The present invention relates to a method of crystallizing amorphous silicon, and more particularly, to a method of crystallizing amorphous silicon into polycrystalline silicon and fabricating an array substrate of polycrystalline silicon for a flat panel display device.

2. Discussion of the Related Art

In general, silicon exists as amorphous silicon or crystalline silicon, such as polycrystalline silicon and single crystalline silicon. Amorphous silicon has been used to form the semiconductor layer of a thin film transistor in a liquid crystal display (LCD) device using a glass substrate because it has a low melting point. Therefore, amorphous silicon can be formed into a thin film at a relatively low temperature.

However, LCD devices include a drive integrated circuit (drive IC) to control the thin film transistors in the LCD, and CMOS (complementary metal oxide semiconductor) devices. CMOS devices require polycrystalline silicon for the semiconductor layer because polycrystalline silicon has excellent field effect mobility. In the LCD device using polycrystalline silicon, because the thin film transistor and drive IC are formed on the same substrate and a process of connecting the thin film transistor and the drive IC is not necessary, the number of steps for fabricating the LCD device can be reduced. The thin film transistor using polycrystalline silicon has also been used for an organic electro-luminescent display device.

Polycrystalline silicon can be formed by deposition on a substrate in a polycrystalline state. Alternately, it can be formed by depositing amorphous silicon, such as by plasma enhanced chemical vapor deposition (PECVD) or low-pressure chemical vapor deposition (LPCVD), and then crystallizing the amorphous silicon into polycrystalline silicon. There are a number of methods of crystallizing amorphous silicon into polycrystalline silicon, such as, for example, solid phase crystallization (SPC) and excimer laser annealing (ELA).

In SPC, amorphous silicon is deposited on the substrate and then annealed at a high temperature between 500 and 600 degrees Celsius for a relatively long time period. In SPC, since a long time period is required, production yield decreases. Also, when the substrate is large, deformation of substrate can occur through a process of annealing at such high temperatures.

Meanwhile, in ELA, radiation from an excimer laser is irradiated onto an amorphous silicon layer on a substrate for an extremely short time period. This causes the amorphous silicon layer to melt. The melting silicon is subsequently solidified into polycrystalline silicon. However, control of the excimer laser irradiation is technically difficult. Also, production yield is relatively low because only one substrate is treated at a time.

To overcome the problems associated with SPC and ELA, a new method of crystallization, often referred to as metal induced crystallization (MIC), has been used. In MIC, a metal, such as nickel, palladium, or other suitable metal, contacts the amorphous silicon, or the metal is injected into the amorphous silicon at a relatively low temperature between 200 and 500 degrees Celsius. However, the metal remaining in the silicon layer causes electrical leakage from the channel of the thin film transistor.

Recently, a method, without direct contact of a metal and amorphous silicon, often referred to as metal induced lateral crystallization (MILC), has been suggested. In MILC, silicide obtained by reacting a metal and silicon is spread onto a lateral side, and a crystallization of amorphous silicon is sequentially induced. With the MILC method, production yield increases because several substrates are treated in a relatively short time period.

FIGS. 1A to 1E are cross-sectional views of a process of fabricating an array substrate including a thin film transistor using the MILC according to the related art.

As shown in FIG. 1A, a buffer layer 15 is formed on a substrate 11, and an amorphous silicon layer (not shown) is formed on the buffer layer 15 by depositing amorphous silicon. An amorphous silicon pattern 20 is formed by patterning the amorphous silicon layer through a mask process.

As shown in FIG. 1B, a gate insulating layer 25 is formed on the amorphous silicon pattern 20 by depositing an inorganic insulating material. A gate electrode 30 is formed on the gate insulating layer 25 corresponding to a center portion of the amorphous silicon pattern 20 by depositing and patterning a metal.

As shown in FIG. 1C, a doped region 20b and an intrinsic region 20a are defined by doping the amorphous silicon layer 20 with impurities using the gate electrode 30 as a doping mask.

As shown in FIG. 1D, an interlayer insulating layer 40 is formed on the gate electrode 30 and the doped region 20b by depositing an inorganic insulating material. The interlayer insulating layer 40 is patterned to have contact holes 45a and 45b, such that the contact holes 45a and 45b expose respective portions of the doped region 20b.

As shown in FIG. 1E, a catalyst metal layer 50 is formed on the doped region 20b exposed through the contact holes 45a and 45b and on the interlayer insulating layer 40 by depositing a metal, such as nickel and palladium. Next, amorphous silicon in the doped region 20b covered by the catalyst metal layer 50 is crystallized into polycrystalline silicon by annealing the substrate 11 at a temperature between 300 and 500 degrees Celsius to cause a reaction between the amorphous silicon and the catalyst metal layer 50. Amorphous silicon in the portion of the doped region 20b not covered by the catalyst metal layer 50 and in the intrinsic region 20a is crystallized into polycrystalline silicon using the MIC phenomenon induced by the catalyst metal layer 50.

However, as shown in FIGS. 2A and 2B, the MILC method has several problems. For example, the gate electrode is partially separated from the gate insulating layer in an interface between the gate electrode and the gate insulating layer. A void between the gate electrode and interlayer insulating layer 40 is generated at the side surface of the gate electrode. Accordingly, characteristics of the thin film transistor are deteriorated.

Typically, signal lines including the gate electrode are made of a metal having relatively low resistivity, such as aluminum and aluminum alloy, to decrease signal delay. However, metals having relatively low resistivity are likely to cause the above problems because such metals have low melting points.

As mentioned above, since a quality of the polycrystalline silicon affects the performance characteristics of the thin film transistor, it is important to remove a metal used as a catalyst from the semiconductor layer of polycrystalline silicon. The metal remaining in the semiconductor layer of polycrystalline silicon may be gathered at a surface of the polycrystalline silicon by heating at a temperature between 300 and 500 degrees Celsius, and under oxygen ($O_2$) condition, and the gathered metal is removed by etching or chemical mechanical polishing a part of the surface of polycrystalline silicon.

However, in MILC according to the related art, since the interlayer covers the semiconductor layer of polycrystalline silicon except a portion of the contact hole, it is difficult to effectively remove the catalyst metal in the semiconductor layer of polycrystalline silicon. Furthermore, since the gate electrode of the metal having relatively low resistivity is on the semiconductor layer of polycrystalline silicon, adhesion between the gate electrode and the gate insulating layer is deteriorated.

SUMMARY OF THE INVENTION

Accordingly, the present invention is directed to a method of fabricating an array substrate for liquid crystal display device that substantially obviate one or more of the problems due to limitations and disadvantages of the related art.

An object of the present invention is to provide an array substrate for a liquid crystal display device including a thin film transistor having a semiconductor layer of polycrystalline silicon of high quality by effectively removing a catalyst metal from the semiconductor layer of polycrystalline silicon.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings without getting loose between a gate electrode and a gate insulating layer.

To achieve these and other advantages and in accordance with the purpose of the present invention, as embodied and broadly described herein, a method of fabricating an array substrate for a liquid crystal display device comprises steps of forming an amorphous silicon pattern on a substrate; forming a catalyst metal pattern on the amorphous silicon pattern; annealing the amorphous silicon pattern to be converted into a polycrystalline silicon pattern using the catalyst metal pattern as a catalyst; forming a gate insulating layer on the polycrystalline silicon pattern; forming a gate electrode on the gate insulation layer at a position corresponding to the polycrystalline silicon pattern; doping the polycrystalline silicon pattern with impurities using the gate electrode as a doping mask to form an ohmic contact layer and an active layer; forming an interlayer insulating layer having first and second contact holes on the gate electrode, the first and second contact holes exposing portions of the ohmic contact layer; and forming a source electrode and a drain electrode on the interlayer insulating layer, the source electrode and the drain electrode connected to the ohmic contact layer respectively through the first and second contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

An exemplary characteristic of a metal induced lateral crystallization (MILC) method used in the present invention is to remove effectively a catalyst metal from a semiconductor layer of polycrystalline silicon. In addition, the MILC method according to the present invention prevents loss of adhesion between a gate electrode and a gate insulating layer. FIGS. 3A to 3L are cross-sectional views showing a fabricating process of an array substrate according to the present invention.

Figure 1A:
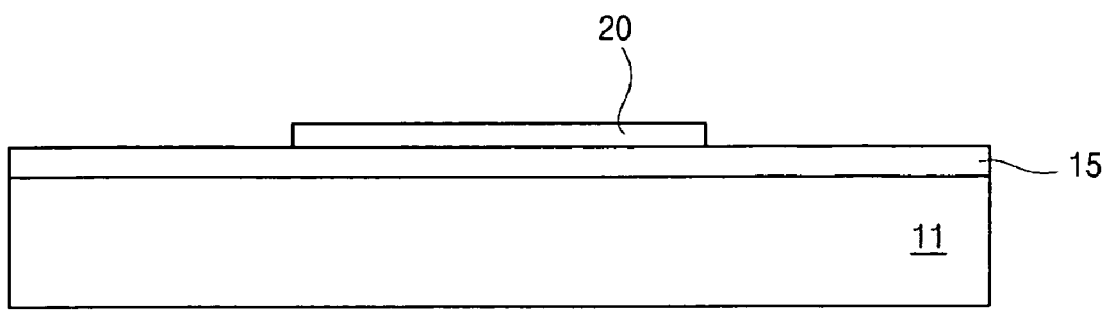
FIGS. 1A to 1E are schematic cross-sectional views showing a fabrication process of an array substrate including a thin film transistor using a metal induced lateral crystallization (MILC) method according to the related art.
Figure 1B:
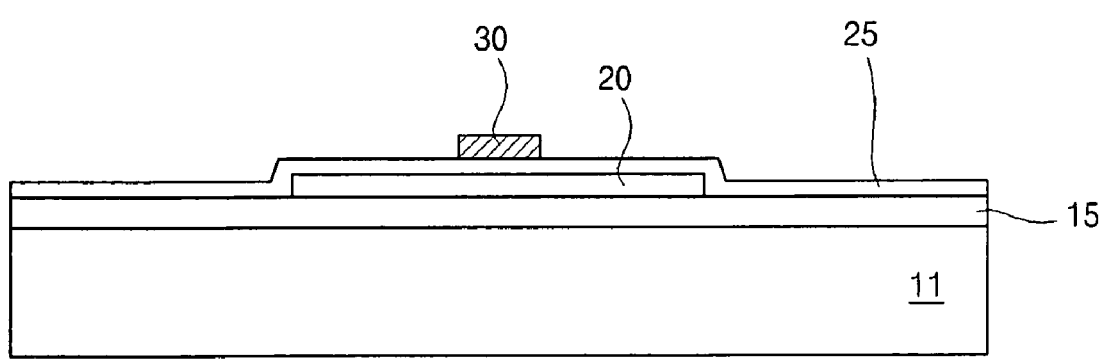
Figure 1C:
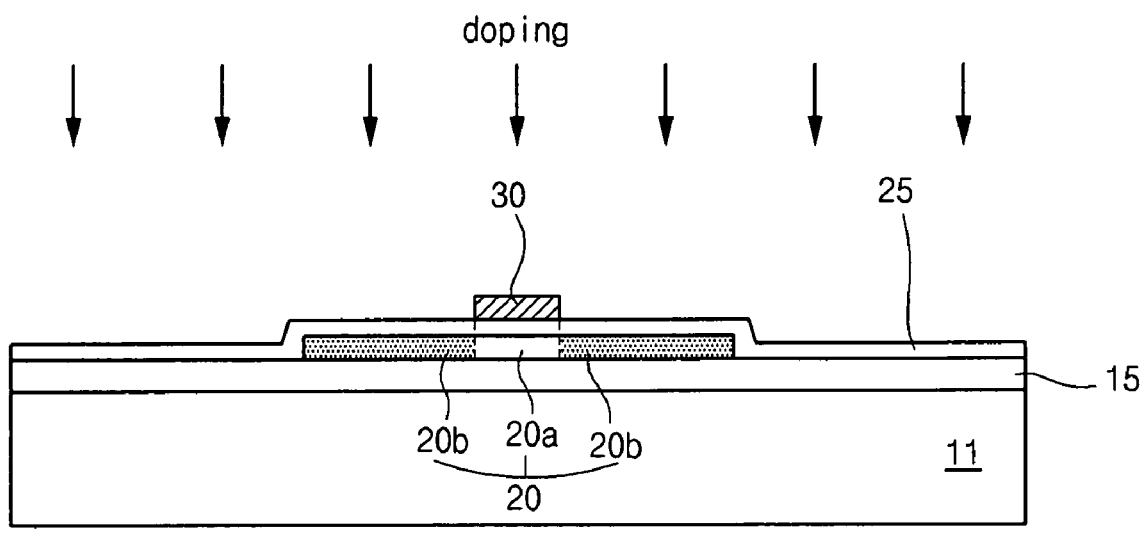
Figure 1D:
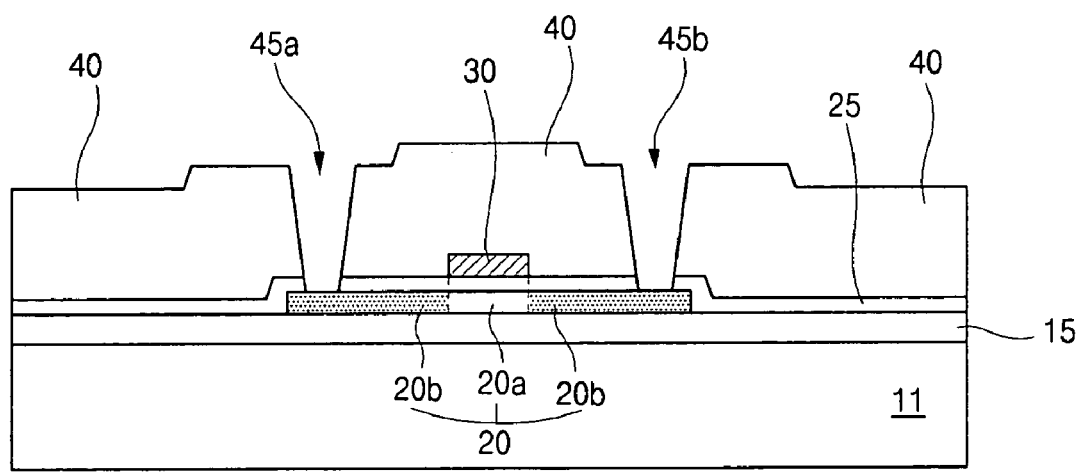
Figure 1E:
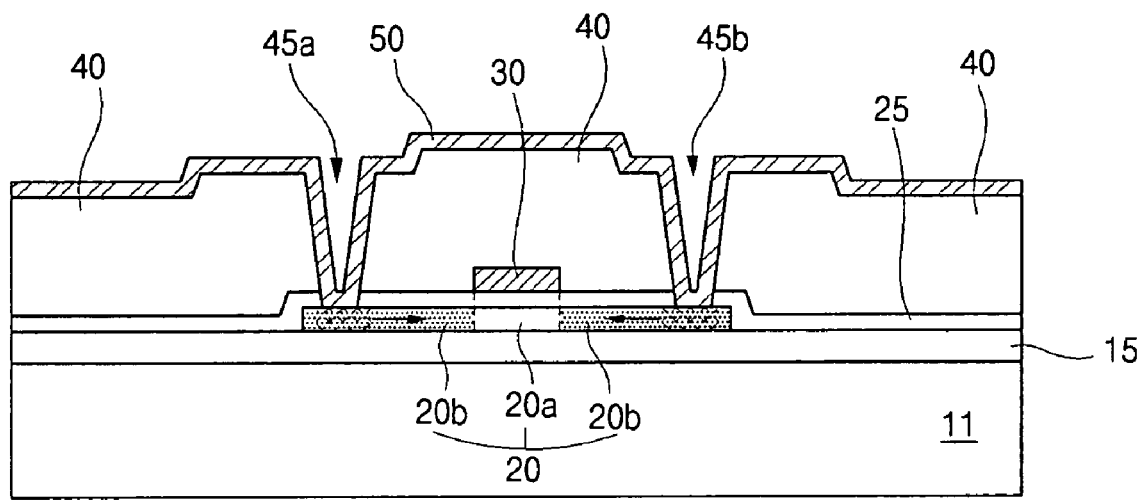
Figure 2A:
FIGS. 2A and 2B are scanning electron microscope (SEM) photographs illustrating peripheries of a gate electrode after an MILC method according to the related art is applied.
Figure 2B:
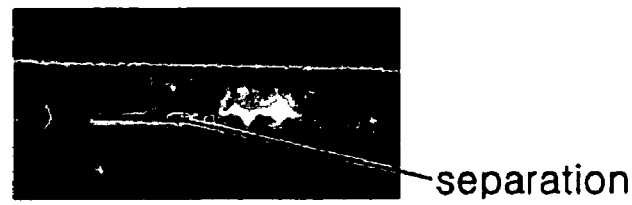
Figure 3A:
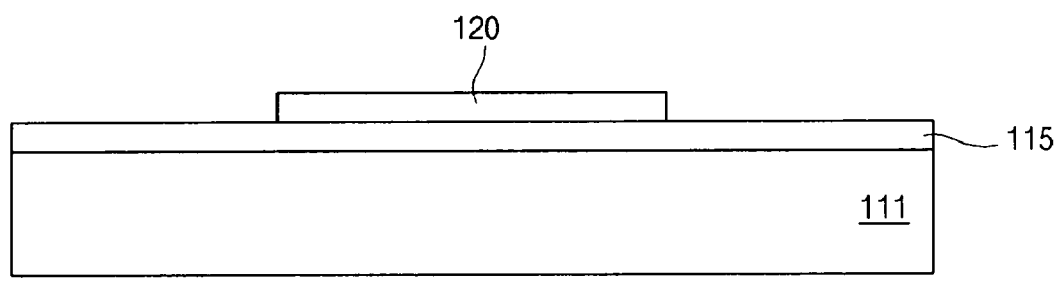
FIGS. 3A to 3L are schematic cross-sectional views showing a fabrication process of an array substrate according to the present invention.

As shown in FIG. 3A, a buffer layer 115 is formed on a substrate 111 by depositing an inorganic insulating material such as silicon nitride ($SiN_x$) or silicon oxide ($SiO_2$). The buffer layer 115 is formed to prevent diffusion of an alkali ion from the substrate 111 to a semiconductor layer by heating in the MIC process. The buffer layer may be omitted in another embodiment. An amorphous silicon layer, not shown, is formed on the buffer layer 115. An amorphous silicon pattern 120 is formed on the buffer layer 115 by patterning the amorphous silicon layer.

Figure 3B:
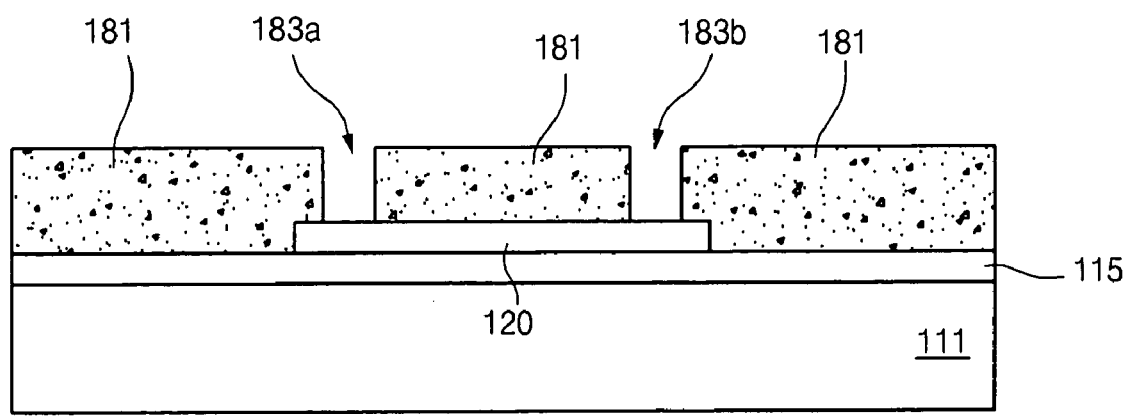

As shown in FIG. 3B, a photoresist (PR) layer (not shown) is coated on the amorphous silicon pattern 120 and then light is irradiated onto the PR layer through a mask. Accordingly, the PR layer is developed to form a photoresist (PR) pattern 181 having first and second contact openings 183a and 183b separated substantially symmetrically from a center of the amorphous silicon pattern 120. The first and second openings 183a and 183b expose respective sides of the amorphous silicon pattern 120.

Figure 3C:
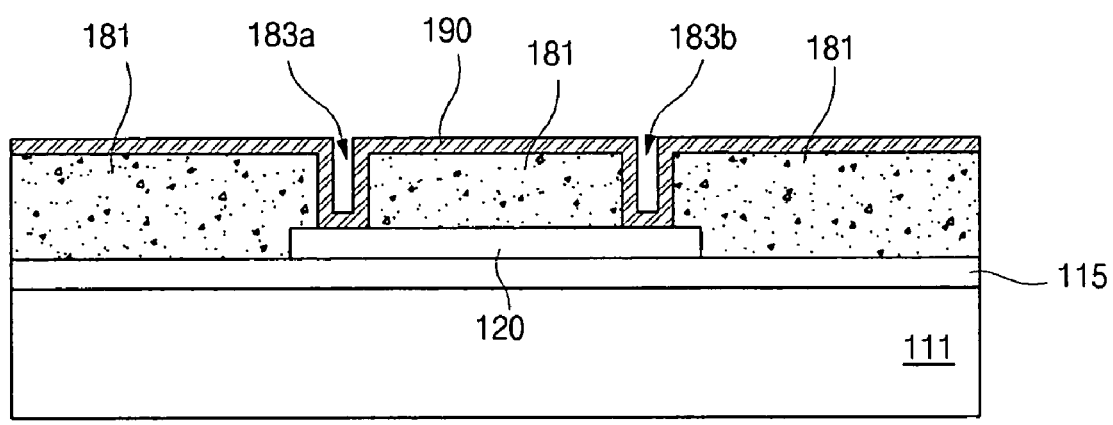

As shown in FIG. 3C, a catalyst metal layer 190 is formed on the PR pattern 181 by depositing a metal. The catalyst metal layer 190 is formed for catalyzing a crystallization of amorphous silicon and is formed of a metal such as nickel or palladium. The catalyst metal layer 190 contacts the amorphous silicon pattern 120 at bottoms of the first and second openings 183a and 183b.

Figure 3D:
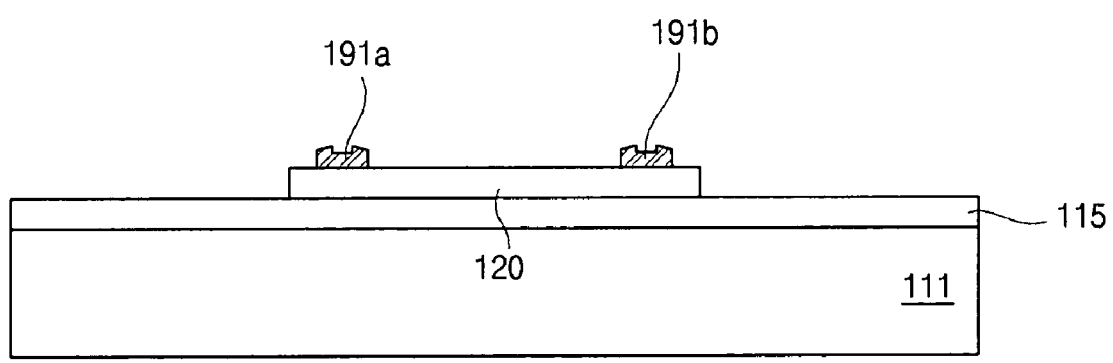

As shown in FIG. 3D, the PR pattern 181 (of FIG. 3C) and catalyst metal layer 190 (of FIG. 3C) on the PR pattern 181 (of FIG. 3C) are stripped from the substrate 111 at the same time using, for example, the lift-off method. Since the PR pattern 181 (of FIG. 3C) reacts with strip liquid, the PR pattern 181 (of FIG. 3C) is stripped from the substrate 111 by dipping the substrate 111 into the strip liquid or spraying strip liquid on the substrate 111. The catalyst metal layer 190 (of FIG. 3C) on the PR pattern 181 (of FIG. 3C) is also stripped from the substrate 111. After the PR pattern 181 is stripped, the catalyst metal layer 190 (of FIG. 3C) which contacts the amorphous silicon pattern 120 remains on the substrate 111. Since the catalyst metal layer 190 (of FIG. 3C) which contacts with the amorphous silicon pattern 120 is stripped partially with the PR pattern 181 (of FIG. 3C), catalyst metal patterns 191a and 191b having uneven shape is formed on the amorphous silicon pattern 120 corresponding to the first and second openings 183a and 183b (of FIG. 3C).

Figure 3E:
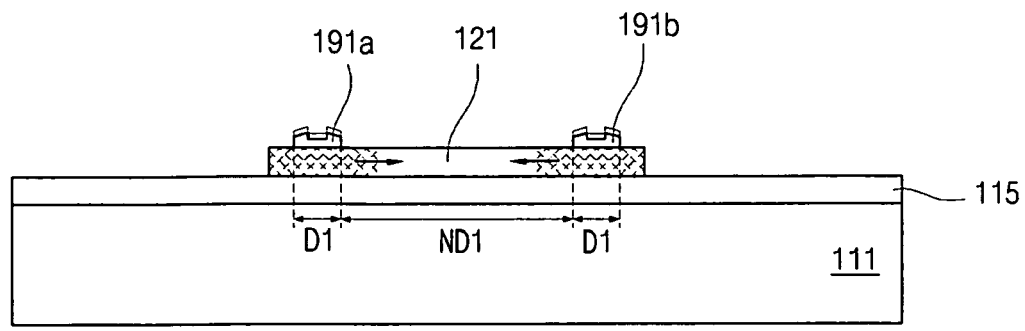

As shown in FIG. 3E, the substrate 111 which has the catalyst metal patterns 191a and 191b is annealed in a chamber (not shown) at a temperature between 300 and 650 degrees Celsius for a time period between several minutes and 2 hours. For example, the substrate 111 is annealed at a temperature between 300 and 650 degrees Celsius for a time period between about 5 minutes and about 30 minutes. The chamber has ambient of one of oxygen, nitrogen and hydrogen. As amorphous silicon in the amorphous silicon pattern 120 (of FIG. 3D) reacts with the catalyst metal patterns 191a and 191b, the amorphous silicon is crystallized into polycrystalline silicon. The amorphous silicon in the contact region D1 corresponding to the catalyst metals pattern 191a and 191b directly reacts with the catalyst metal patterns 191a and 191b and is then crystallized. The amorphous silicon in the non-contact region ND1 is crystallized by MILC phenomenon induced from the catalyst metal pattern 191a and 191b. Accordingly, the polycrystalline silicon pattern 121 is formed through the MILC process of the amorphous silicon pattern 120 (of FIG. 3D). A thickness of the catalyst metal patterns 191a and 191b gradually decreases as the catalyst metal patterns 191a and 191b react with the amorphous silicon pattern 120 (of FIG. 3D). The catalyst metal patterns 191a and 191b may be eliminated or remain in part after the annealing has finished depending on a thickness of the catalyst metal layer 190.

Figure 3F:
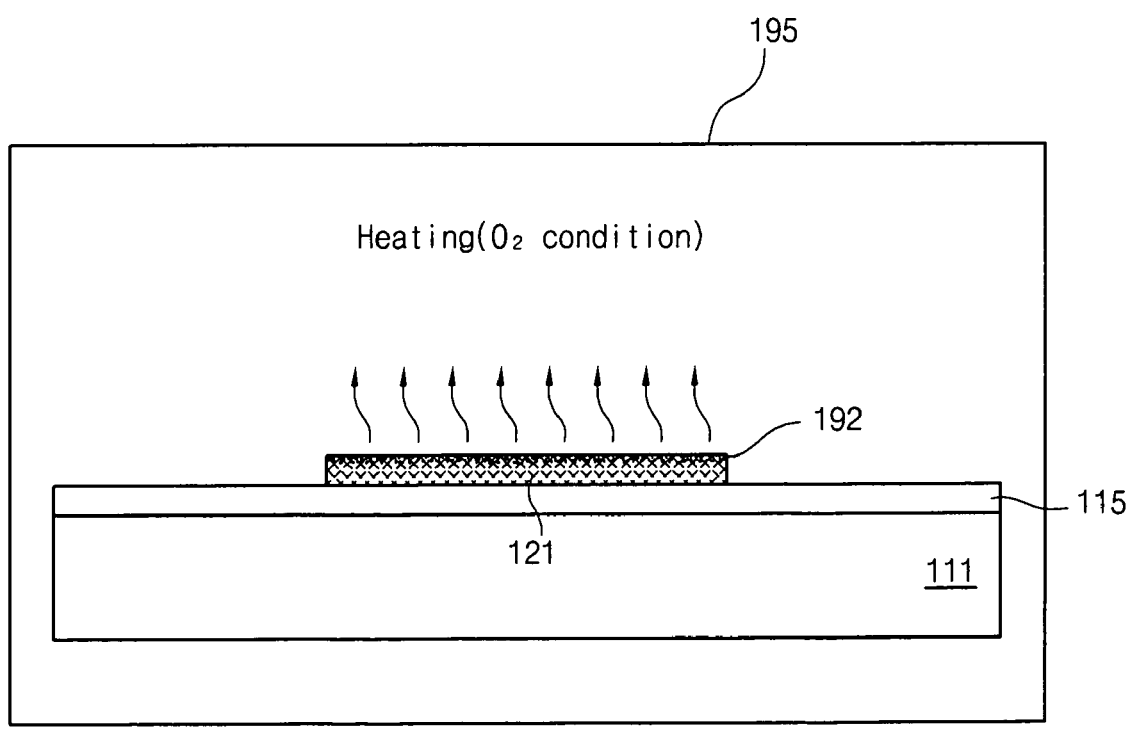

As shown in FIG. 3F, the substrate 111 which has a polycrystalline pattern 121 is heated in a chamber 195 under oxygen conditions at a temperature between 300 and 650 degrees Celsius for a time period between several minutes and 2 hours. For example, the substrate is heated at temperature between 550 and 650 degrees Celsius for a time period between 5 minutes and 30 hours. The catalyst metal 192, such as nickel, in the polycrystalline silicon pattern 121 is gathered at a surface of the polycrystalline silicon pattern 121 through the heating process.

Figure 3G:
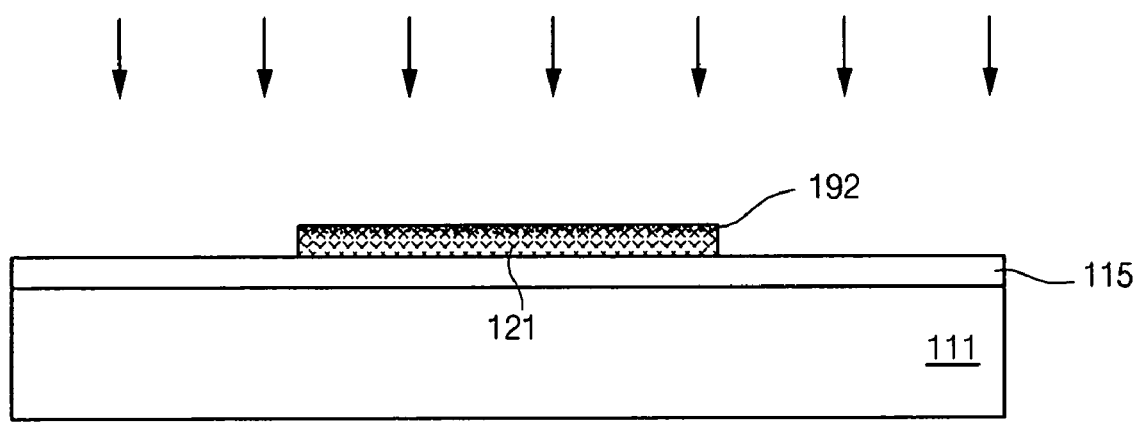

As shown in FIG. 3G, a catalyst metal 192 at a surface of the polycrystalline silicon pattern 121 is removed by dry or wet etching, or by chemical or mechanical polishing the surface of the polycrystalline silicon pattern 121. Accordingly, the polycrystalline silicon pattern 121 does not have the catalyst metal 192, and a characteristic of a thin film transistor according to the present invention is improved. Since the MILC process of the present invention proceeds without forming a gate insulating layer and a gate electrode on the polycrystalline silicon pattern, reduction of adhesion between the gate electrode and the gate insulating layer is prevented and a void between an interlayer and a side of the gate electrode is prevented.

Figure 3H:
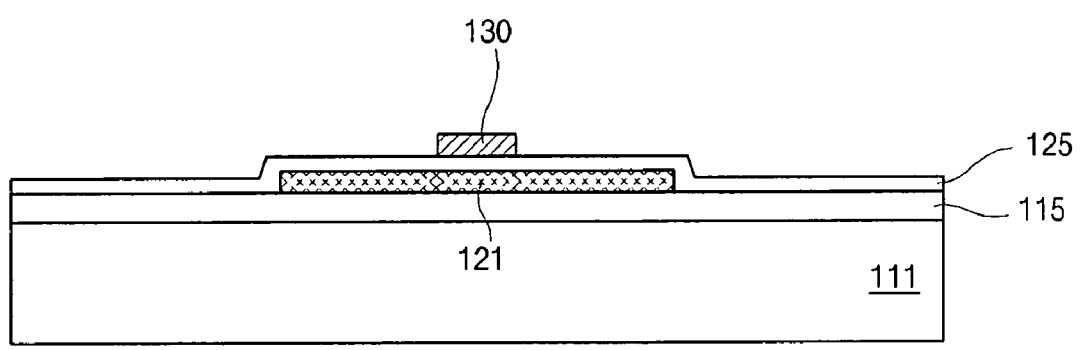

As shown in FIG. 3H, a gate insulating layer 125 is formed on a polycrystalline silicon pattern 121 by depositing an inorganic insulating material, such as silicon oxide or silicon nitride. A gate electrode 130 is formed on the gate insulating layer 125 corresponding to a center of the polycrystalline silicon pattern 121 by depositing and patterning a metal having relatively low resistivity, such as aluminum and aluminum alloy. A gate line, not shown, is formed on the gate insulating layer 125 at the same time. In FIG. 3H, the gate electrode 130 has a single layer of metal having relatively low resistivity. However, the gate electrode 130 can include a metal layer having relatively low resistivity and another metal layer having a relatively high melting point.

Figure 3I:
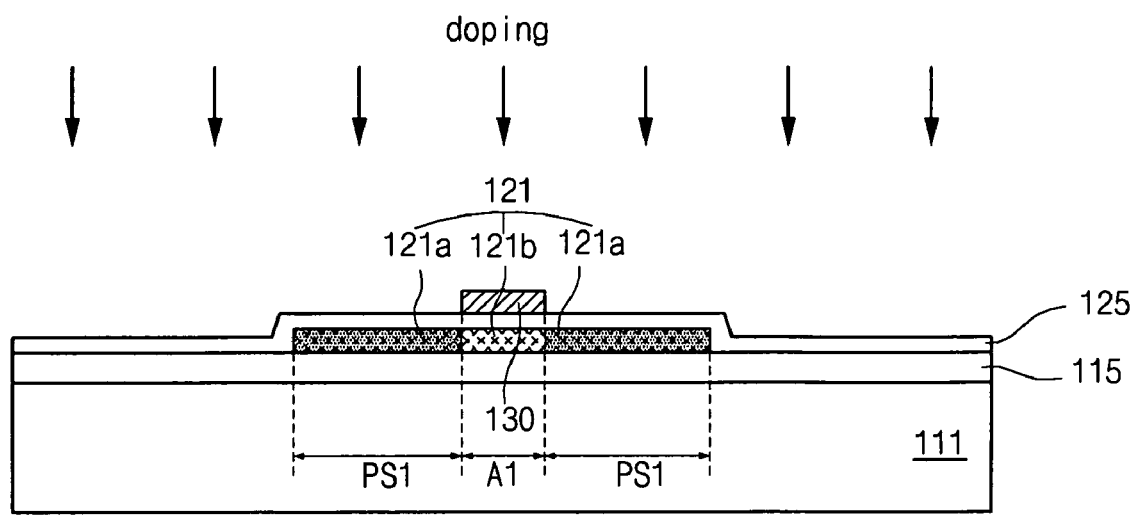

As shown in FIG. 3I, an ohmic contact layer 121a is formed at both sides of the polycrystalline silicon pattern 121 by doping the polycrystalline silicon pattern 121 with impurities using the gate electrode 130 as a doping mask. A non-doped region A1 in a center of the polycrystalline silicon pattern 121 is defined as an active layer 121b which forms a channel region of a thin film transistor. When a doping process of $n^+$ type is performed, a lightly doped drain (LDD) (not shown) can be formed between the ohmic contact layer 121a and the active layer 121b by doping process of $n^-$ type. The LDD is formed to prevent the ohmic contact layer 121a from being heated by hot carrier.

The LDD may be formed by the following process. A metal layer is formed on a gate insulating layer, and a PR pattern is formed on the metal layer by coating, exposing and developing a PR. Next, a gate electrode having a width smaller than that of the PR pattern is formed by controlling an etch ratio or an etch rate. A doping process of $n^+$ type is performed using the PR pattern as a doping mask. Accordingly, a non-doped region of a polycrystalline silicon pattern is defined as an active layer, and a doped region is defined as an ohmic contact layer. After the PR pattern is stripped, a doping process of $n^-$ type is performed using the gate electrode as a doping mask. As a result, the LDD is defined between the active layer and the ohmic contact layer.

Figure 3J:
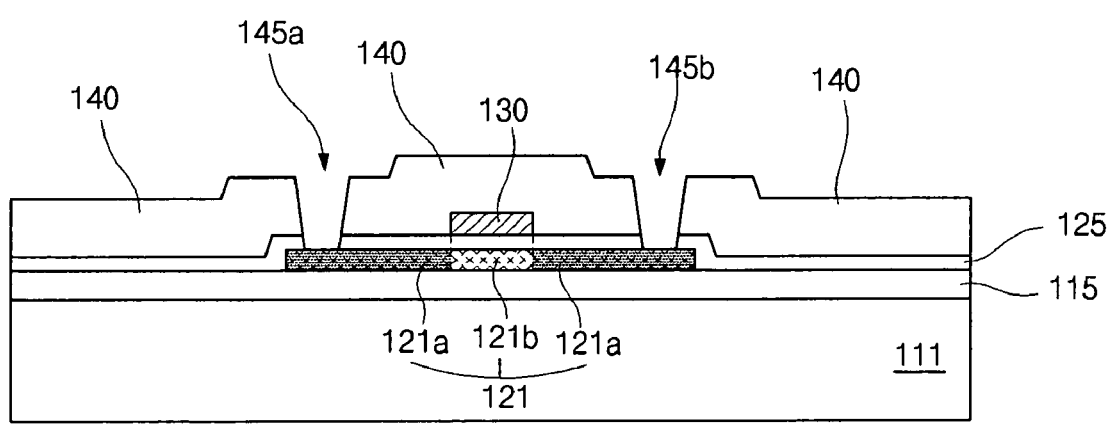

As shown in FIG. 3J, an interlayer insulating layer 140 is formed on a gate electrode 130 and on the gate insulating layer 125 by depositing an inorganic insulating material, such as silicon oxide or silicon nitride, or coating with an organic insulating material, such as benzocyclobutene or photo-acrylate. First and second contact holes 145a and 145b are formed through the interlayer insulating layer 140 and a gate insulating layer 125 by simultaneous or sequential mask process. The first and second contact holes 145a and 145b expose a part of an ohmic contact layer 121a.

Figure 3K:
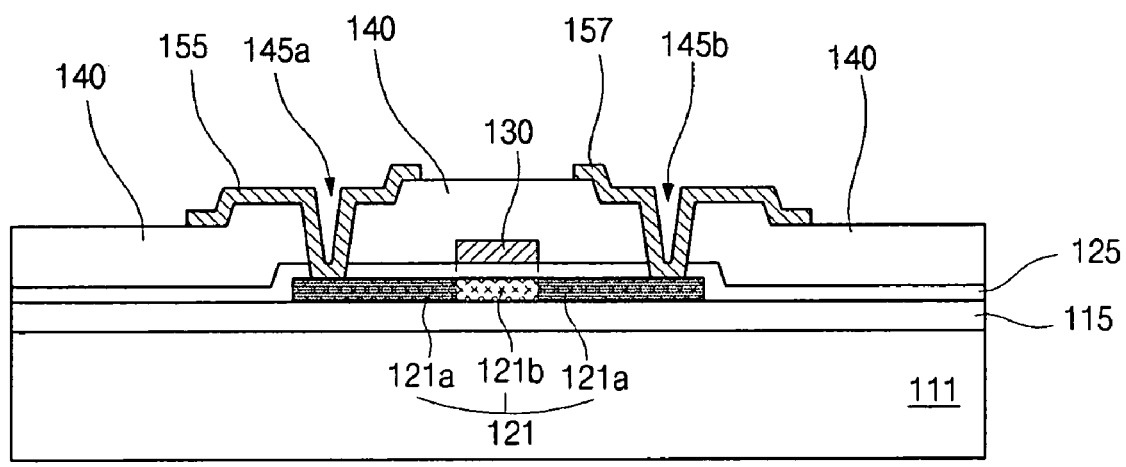

As shown in FIG. 3K, a source electrode 155 and a drain electrode 157, which are separated from each other, are formed on an interlayer insulating layer 140 by depositing and patterning a metal. The source and drain electrodes 155 and 157 contact the ohmic contact layer 121a through first and second contact hole 145a and 145b, respectively. At the same time, a data line (not shown) is formed on the interlayer insulating layer 140 to be connected to the source electrode 155 and cross the gate line (not shown).

Figure 3L:
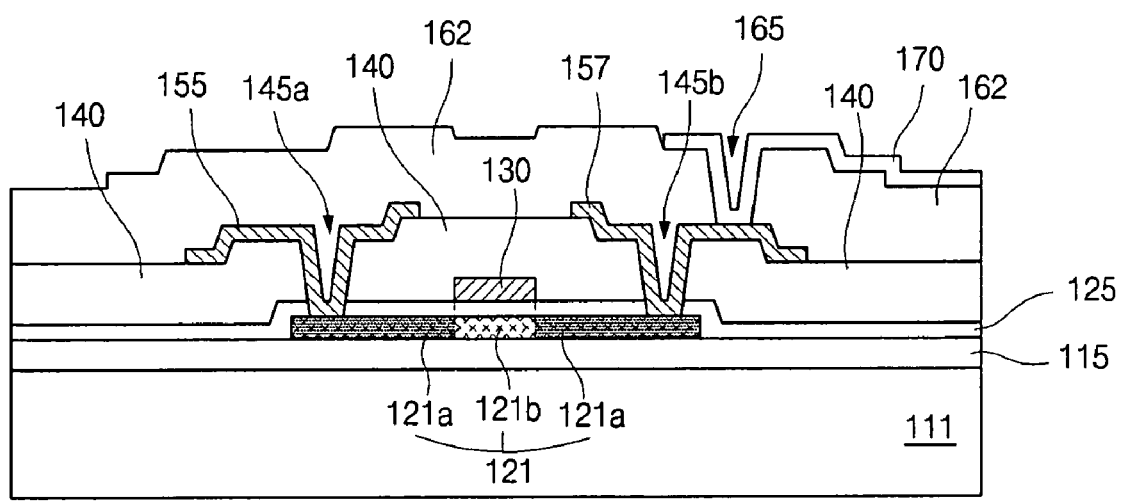

As shown in FIG. 3L, a passivation layer 162 is formed on the source and drain electrodes 155 and 157 by depositing an inorganic insulating material, such as silicon oxide or silicon nitride, or coating with an organic insulating material, such as benzocyclobutene or photo-acrylate. The passivation layer 162 has a drain contact hole 165 exposing the drain electrode 157. A pixel electrode 170 is formed on the passivation layer 162 by depositing and patterning a transparent conductive material, such as indium-tin-oxide (ITO) or indium-zinc-oxide (IZO). The pixel electrode 170 contacts the drain electrode 157 through the drain contact hole 165.

Accordingly, a polycrystalline silicon pattern is formed by crystallizing an amorphous silicon pattern through a MILC process before a gate electrode is formed. As a result, problems such as separation and a void adjacent to the gate electrode are prevented.

It will be apparent to those skilled in the art that various modifications and variations can be made in the method of fabricating an array substrate for a liquid crystal display device of the present invention without departing from the sprit or scope of the invention. Thus, it is intended that the present invention covers the modifications and variations of this invention provided they come within the scope of the appended claims and their equivalents.

What is claimed is:

1. A method of fabricating an array substrate for a liquid crystal display device, comprising steps of:
   forming an amorphous silicon pattern on a substrate;
   forming a catalyst metal pattern on the amorphous silicon pattern;
   annealing the amorphous silicon pattern to be converted into a polycrystalline silicon pattern using the catalyst metal pattern as a catalyst;
   forming a gate insulating layer on the polycrystalline silicon pattern; forming a gate electrode on the gate insulation layer at a position corresponding to the polycrystalline silicon pattern;
   doping the polycrystalline silicon pattern with impurities using the gate electrode as a doping mask to form an ohmic contact layer and an active layer;
   forming an interlayer insulating layer having first and second contact holes on the gate electrode, the first and second contact holes exposing portions of the ohmic contact layer; and
   forming a source electrode and a drain electrode on the interlayer insulating layer, the source electrode and the drain electrode connected to the ohmic contact layer respectively through the first and second contact holes,
   wherein the step of forming the catalyst metal pattern includes forming a photoresist pattern on the amorphous silicon pattern, the photoresist pattern having at least two openings exposing the amorphous silicon pattern, forming a catalyst metal layer on the photoresist pattern, and removing the photoresist pattern and the catalyst metal layer on the photoresist pattern so that the catalyst metal pattern remains on the amorphous silicon pattern.

2. The method according to claim 1, wherein
   first and second openings of the at least two openings correspond to both ends of the amorphous silicon pattern, respectively.

3. The method according to claim 1, further comprising a step of heating the polycrystalline silicon pattern so that catalyst metal remaining in the polycrystalline silicon pattern is gathered at a surface of the polycrystalline silicon pattern.

4. The method according to claim 3, wherein the step of heating the polycrystalline silicon pattern is performed under an oxygen ambient.

5. The method according to claim 3, wherein the step of heating the polycrystalline silicon pattern is performed at a temperature range between about 300 and about 650 degrees Celsius for a time period less than about 2 hours.

6. The method according to claim 3, wherein the step of heating the polycrystalline silicon pattern is performed at a temperature range between about 550 and about 650 degrees Celsius for a time period less than about 30 minutes.

7. The method according to claim 3, further comprising a step of eliminating the catalyst metal on the surface of the polycrystalline silicon pattern.

8. The method according to claim 7, wherein the step of eliminating the catalyst metal includes one of an etching method and a polishing method.

9. The method according to claim 3, wherein the gathered catalyst metal forms a layer on the surface of the polycrystalline silicon pattern.

10. The method according to claim 9, further comprising a step of eliminating the layer on the surface of the polycrystalline silicon pattern.

11. The method according to claim 10, wherein the step of eliminating the layer on the surface of the polycrystalline silicon pattern includes one of an etching method and a polishing method.

12. The method according to claim 1, further comprising steps of:
    forming a passivation layer on the source electrode and the drain electrode, the passivation layer having a drain contact hole exposing the drain electrode; and
    forming a pixel electrode on the passivation layer and connected to the drain electrode.

13. The method according to claim 1, wherein the step of annealing the amorphous silicon pattern is performed under an ambient including one of oxygen, nitrogen and hydrogen.

14. The method according to claim 1, wherein the step of annealing the amorphous silicon pattern is performed at a temperature range between 300 and 650 degrees Celsius.

15. The method according to claim 1, the step of annealing the amorphous silicon pattern is performed for less than about 2 hours.

16. The method according to claim 1, wherein the annealing the amorphous silicon pattern is performed at a temperature range between 550 and 650 degrees Celsius for less than about 30 minutes.

17. The method according to claim 1, wherein the catalyst metal layer includes one of nickel and palladium.

18. The method according to claim 1, further comprising a step of forming a buffer layer on the substrate, wherein the step of forming the amorphous silicon pattern includes forming the amorphous silicon pattern on the buffer layer.

* * * * *